United States Patent
Surasigcha et al.

(10) Patent No.: US 9,370,108 B2
(45) Date of Patent: Jun. 14, 2016

(54) STENCIL ASSEMBLY STRUCTURE

(71) Applicant: DET International Holding Limited, George Town (KY)

(72) Inventors: Ruay Surasigcha, Samutprakarn (TH); Pornthep Sukkhee, Samutprakarn (TH)

(73) Assignee: DET INTERNATIONAL HOLDING LIMITED, George Town (KY)

(*) Notice: Subject to any disclaimer, the term of this patent is extended or adjusted under 35 U.S.C. 154(b) by 0 days.

(21) Appl. No.: 14/699,008

(22) Filed: Apr. 29, 2015

(65) Prior Publication Data

US 2015/0245495 A1 Aug. 27, 2015

Related U.S. Application Data

(63) Continuation-in-part of application No. 14/156,074, filed on Jan. 15, 2014, now Pat. No. 9,044,930.

(30) Foreign Application Priority Data

Dec. 31, 2013 (TW) .............................. 102149252 A

(51) Int. Cl.
| | |
|---|---|
| *B41F 15/36* | (2006.01) |
| *H05K 3/00* | (2006.01) |
| *B05C 21/00* | (2006.01) |
| *B41F 15/34* | (2006.01) |
| *B41F 15/38* | (2006.01) |
| *B41L 13/02* | (2006.01) |

(52) U.S. Cl.
CPC ............ *H05K 3/0079* (2013.01); *B05C 21/005* (2013.01); *B41F 15/34* (2013.01); *B41F 15/36* (2013.01); *B41F 15/38* (2013.01); *B41L 13/02* (2013.01)

(58) Field of Classification Search
CPC ....................................................... B41F 15/36
See application file for complete search history.

(56) References Cited

U.S. PATENT DOCUMENTS

| | | | |
|---|---|---|---|
| 2,757,607 A | 8/1956 | Fordyce | |
| 2,818,803 A | 1/1958 | Levorson | |
| 3,176,843 A * | 4/1965 | Hoskins | .................... B07B 1/48 |
| | | | 101/127.1 |
| 3,414,994 A * | 12/1968 | Jaccard | ................... B41F 15/36 |
| | | | 101/127.1 |
| 3,608,484 A * | 9/1971 | Bubley | .................... B41F 15/36 |
| | | | 101/127.1 |
| 3,776,382 A * | 12/1973 | Wright | ...................... B07B 1/49 |
| | | | 101/127.1 |
| 4,442,772 A * | 4/1984 | Bubley | .................... B41F 15/36 |
| | | | 101/127.1 |

(Continued)

FOREIGN PATENT DOCUMENTS

| | | |
|---|---|---|
| TW | M321842 | 11/2007 |
| TW | 201315322 | 4/2013 |

*Primary Examiner* — Jill Culler
(74) *Attorney, Agent, or Firm* — Kirton McConkie; Evan R. Witt

(57) ABSTRACT

A stencil assembly structure used for printing solder paste on a printed circuit board includes a stencil, a fixing frame, a deformable tube and a gas supplying device. The stencil includes plural first apertures and plural second apertures. The plural first apertures are collaboratively defined as a solder paste printing region. The fixing frame includes a frame body and plural fixing seats, and each fixing seat has a guide pin. After the plural guide pins are penetrated through the corresponding second apertures of the stencil, the stencil is fixed on the fixing seats. The deformable tube is disposed at bottoms of the fixing seats. The gas supplying device is connected with the deformable tube to adjust gas amount in the deformable tube. Due to deformation of the deformable tube resulted from gas pressure in the deformable tube, the guide pins are moved and a tension of the stencil is adjusted.

14 Claims, 9 Drawing Sheets

(56) References Cited

U.S. PATENT DOCUMENTS

| | | | | |
|---|---|---|---|---|
| 4,816,153 A | * | 3/1989 | Ando | B07B 1/48 209/319 |
| 5,129,171 A | * | 7/1992 | Arbter | D05C 9/04 112/103 |
| 5,732,624 A | | 3/1998 | Karlyn et al. | |
| 5,775,220 A | * | 7/1998 | Thatcher | B41F 15/10 101/115 |
| 5,941,171 A | | 8/1999 | Fromm | |
| 5,979,313 A | * | 11/1999 | Fromm | B41F 15/36 101/127.1 |
| 6,038,969 A | * | 3/2000 | Podlipec | B41F 15/36 101/127 |

\* cited by examiner

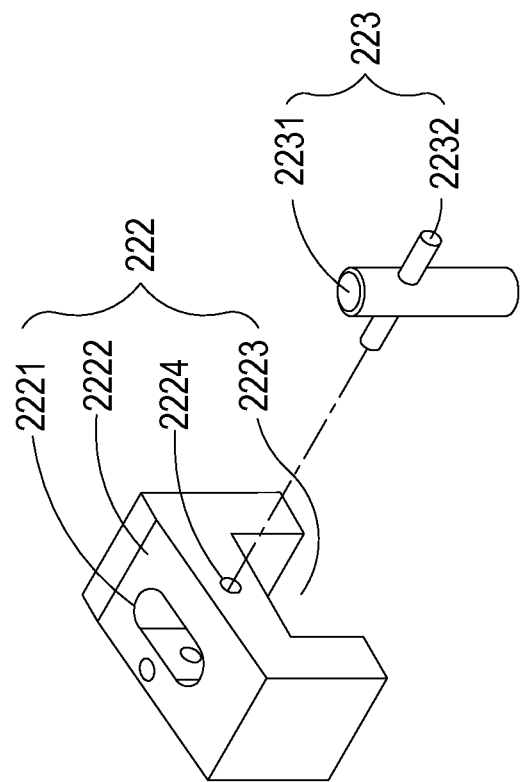
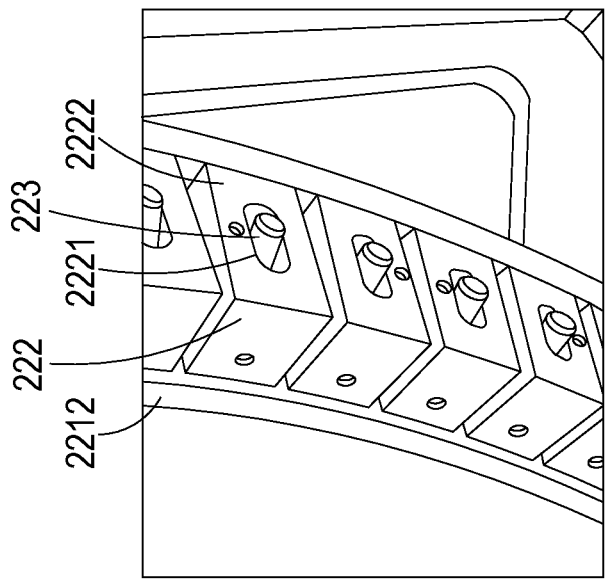
FIG. 4C
FIG. 4B ic # STENCIL ASSEMBLY STRUCTURE

CROSS-REFERENCE TO RELATED APPLICATIONS

The present application is a continuation-in-part of U.S. patent application Ser. No. 14/156,074 entitled "STENCIL ASSEMBLY STRUCTURE" filed on Jan. 15, 2014, the entirety of which is hereby incorporated by reference.

FIELD OF THE INVENTION

The present invention relates to a stencil assembly structure, and more particularly to a stencil assembly structure for printing solder paste on a printed circuit board.

BACKGROUND OF THE INVENTION

A surface mount technology (SMT) is a method for mounting electronic components on the surface of a printed circuit board. The surface mount technology is capable of automatically fabricating small-sized, reliable, high-density and cost-effective electronic products. Generally, the solder paste printing pattern for the surface mount technology is defined by the apertures of a stencil. In addition, solder paste may pass through the apertures of the stencil to corresponding bonding pads of the printed circuit board. In other words, the stencil is a very important part of the surface mount technology. Moreover, the tension of the stencil should be maintained at a certain level. By the tension, the solder paste printed on the bonding pads will not stain the stencil, and thus the solder paste will not be detached. That is, if the tension is insufficient, the printing quality is deteriorated.

FIG. 1 is a schematic exploded view illustrating a conventional assembled solder paste printing structure for printing solder paste on a printed circuit board. As shown in FIG. 1, the conventional assembled solder paste printing structure 9 comprises a fixing frame 91, a hollowed-out rectangular stretching net 92, and a steel plate 93. The steel plate 93 is rectangular, and has a rectangular solder paste printing region 931 and a fixing region 932. The four sides of the solder paste printing region 931 are surrounded by the fixing region 932. The solder paste printing region 931 comprises plural apertures 9311 for providing solder paste. The fixing region 932 is attached on inner edges of four sides of the stretching net 92. Consequently, equal pulling forces are applied to the outer edges of the four sides of the stretching net 92 to outwardly tighten the stretching net 92 in order flatten the steel plate 93. Then, the steel plate 93 is fixed in the clamping slots 911 at the four sides of the fixing frame 91.

A process of using the conventional assembled solder paste printing structure 9 will be illustrated as follows. Firstly, a printed circuit board (not shown) is fixed on a platform (not shown) of a machine (not shown) horizontally. Then, the fixing frame 91 of the conventional assembled solder paste printing structure 9 is fixed on the machine. Then, the steel plate 93 of the conventional assembled solder paste printing structure 9 is aligned with and placed on the printed circuit board. Then, solder paste is scraped across the solder paste printing region 931 of the steel plate 93, so that the solder paste is provided within the apertures 9311 of the steel plate 93 and adhered on the printed circuit board. Afterwards, the conventional assembled solder paste printing structure 9 is removed. Consequently, plural solder paste spots are spread on the printed circuit board, and the printed circuit board is further processed.

However, the use of the conventional assembled solder paste printing structure still has some drawbacks. For example, since the tension is not uniformly and properly distributed on the rectangular steel plate, the printing quality is usually unsatisfied. Moreover, after the conventional assembled solder paste printing structure has been used for a certain time period, the tension of the rectangular steel plate is possibly destroyed and impaired. Moreover, since the conventional assembled solder paste printing structure cannot be disassembled, the conventional assembled solder paste printing structure fails to match various printed circuit boards. Under this circumstance, the assembling process is complicated, and the assembling cost is increased.

Therefore, there is a need of providing an improved stencil assembly structure in order to eliminate the above drawbacks.

SUMMARY OF THE INVENTION

The present invention provides a stencil assembly structure for printing solder paste on a printed circuit board. The stencil assembly structure can be fabricated in a simplified and cost-effective manner. Moreover, the tension of the stencil can be uniformly adjusted to be maintained at a sufficient level and uniform distribution. Under this circumstance, the possibility of detaching the solder paste is minimized, and the printing quality is enhanced.

An aspect of the present invention provides a stencil assembly structure for printing solder paste on a printed circuit board. The stencil assembly structure comprises a stencil, a fixing frame, a deformable tube and a gas supplying device. The stencil comprises plural first apertures and plural second apertures, wherein the plural first apertures are collaboratively defined as a solder paste printing pattern. The fixing frame comprises a frame body and plural fixing seats, wherein the plural fixing seats are independently and discretely disposed on the frame body and have a circular arrangement, each of the plural fixing seats has a guide pin, and after the plural guide pins of the plural fixing seats are penetrated through the corresponding second apertures of the stencil, the stencil is fixed on the plural fixing seats. The deformable tube is disposed at bottoms of the plural fixing seats. The gas supplying device is connected with the deformable tube and configured to adjust gas amount in the deformable tube, wherein due to deformation of the deformable tube resulted from gas pressure in the deformable tube, the plural guide pins are moved and a tension of the stencil is adjusted.

In an embodiment, the stencil is a circular stencil.

In an embodiment, the frame body comprises a rectangular support region and a ring-shaped support region, and the ring-shaped support region is located inside the rectangular support region.

In an embodiment, the frame body comprises plural ribs connected between the rectangular support region and the ring-shaped support region.

In an embodiment, the fixing frame further comprises an outer frame plate disposed on the rectangular support region.

In an embodiment, the plural fixing seats are arranged on the ring-shaped support region.

In an embodiment, any two adjacent fixing seats have the same interval.

In an embodiment, each of the plural fixing seats comprises a slot for allowing a corresponding guide pin to pass through, and each of the plural guide pins is protruded out of a top surface of the corresponding fixing seat.

In an embodiment, the fixing seat has a generally inverted U-shaped structure with a bottom notch, and a lower portion of the guide pin is accommodated in the bottom notch.

In an embodiment, the deformable tube is accommodated in the bottom notch of the fixing seat.

In an embodiment, with respect to the guide pin, the deformable tube is located at a side away from a center of the stencil.

In an embodiment, when the gas supplying device fills gas into the deformable tube, the deformable tube pushes a lower portion of the guide pin, so that a top portion of the guide pin is moved away from a center of the stencil, and since the stencil is hitched on the guide pins, the tension of the stencil is correspondingly adjusted.

In an embodiment, the guide pin is axially connected with the fixing seat, so that the guide pin is able to be rotated or swung with respect to the fixing seat.

In an embodiment, the guide pin comprises a shaft which is penetrated through two corresponding perforations of the fixing seat, so that the guide pin is able to be rotated or swung with respect to the fixing seat.

In an embodiment, the fixing frame further comprises a locking ring for locking the stencil on the plural fixing seats.

The above contents of the present invention will become more readily apparent to those ordinarily skilled in the art after reviewing the following detailed description and accompanying drawings, in which:

BRIEF DESCRIPTION OF THE DRAWINGS

FIG. 4B is a schematic perspective view illustrating a portion of the fixing frame of the stencil assembly structure according to the embodiment of the present invention;

FIG. 4C is a schematic exploded view illustrating a fixing seat and a guide pin of the fixing frame of the stencil assembly structure according to the embodiment of the present invention;

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 1:
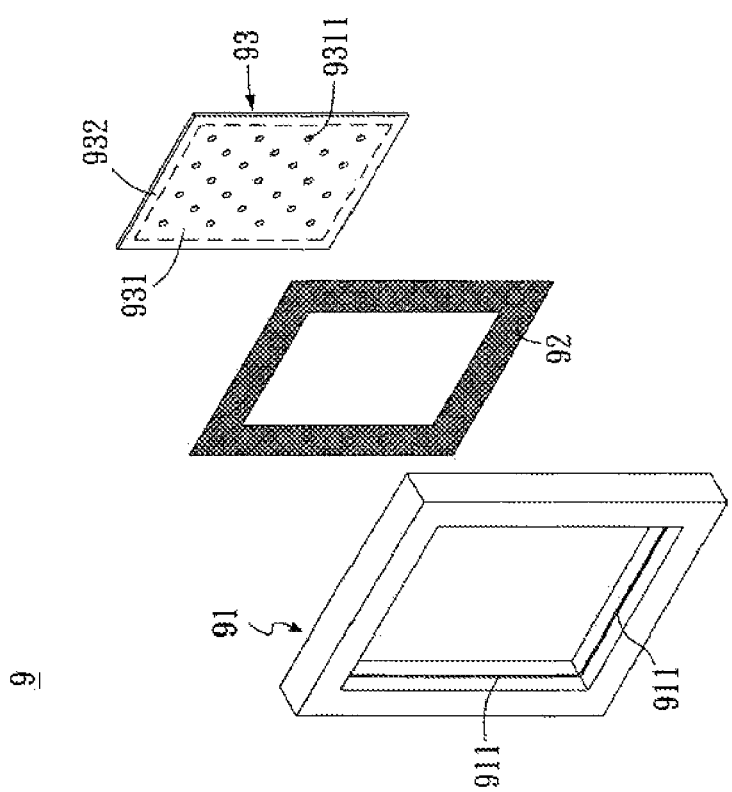
FIG. 1 is a schematic exploded view illustrating a conventional assembled solder paste printing structure for printing solder paste on a printed circuit board.
Figure 2:
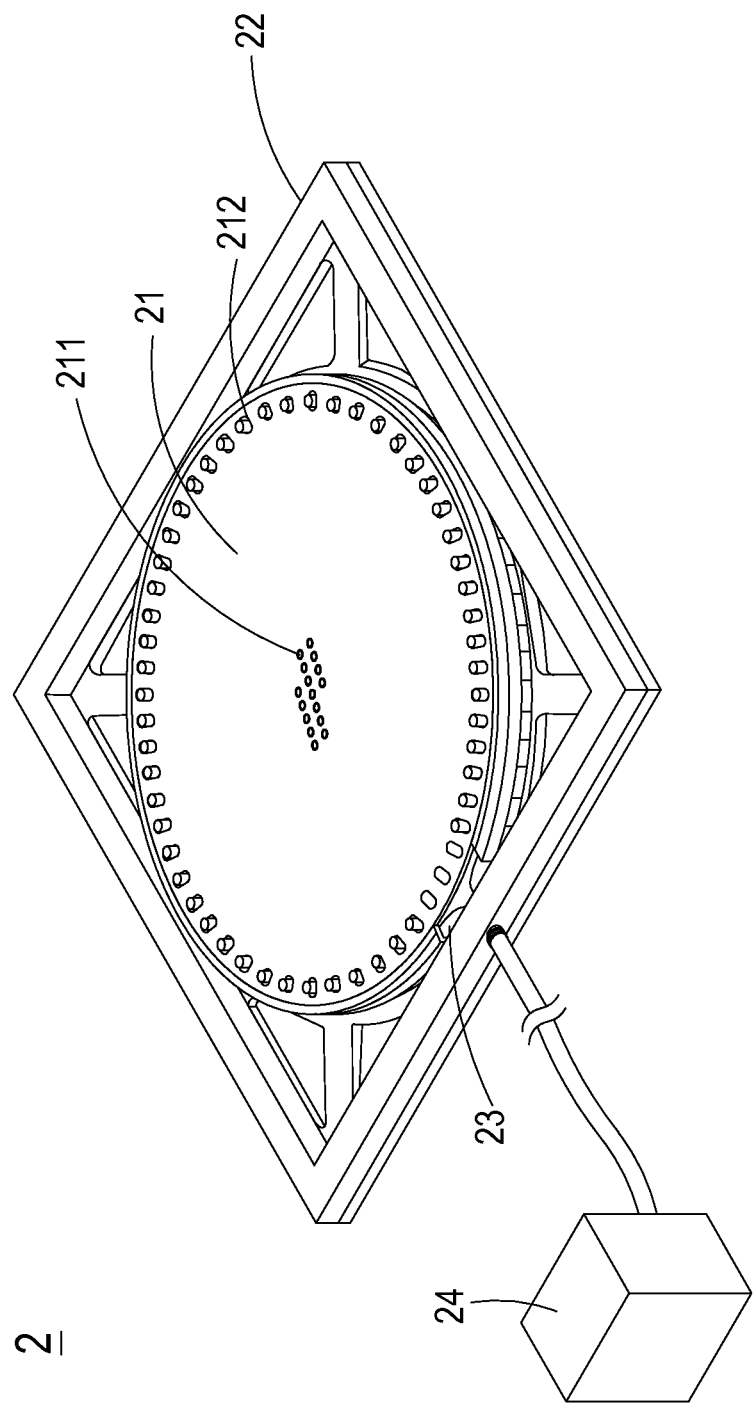
FIG. 2 is a schematic view illustrating a stencil assembly structure according to an embodiment of the present invention.
Figure 3:
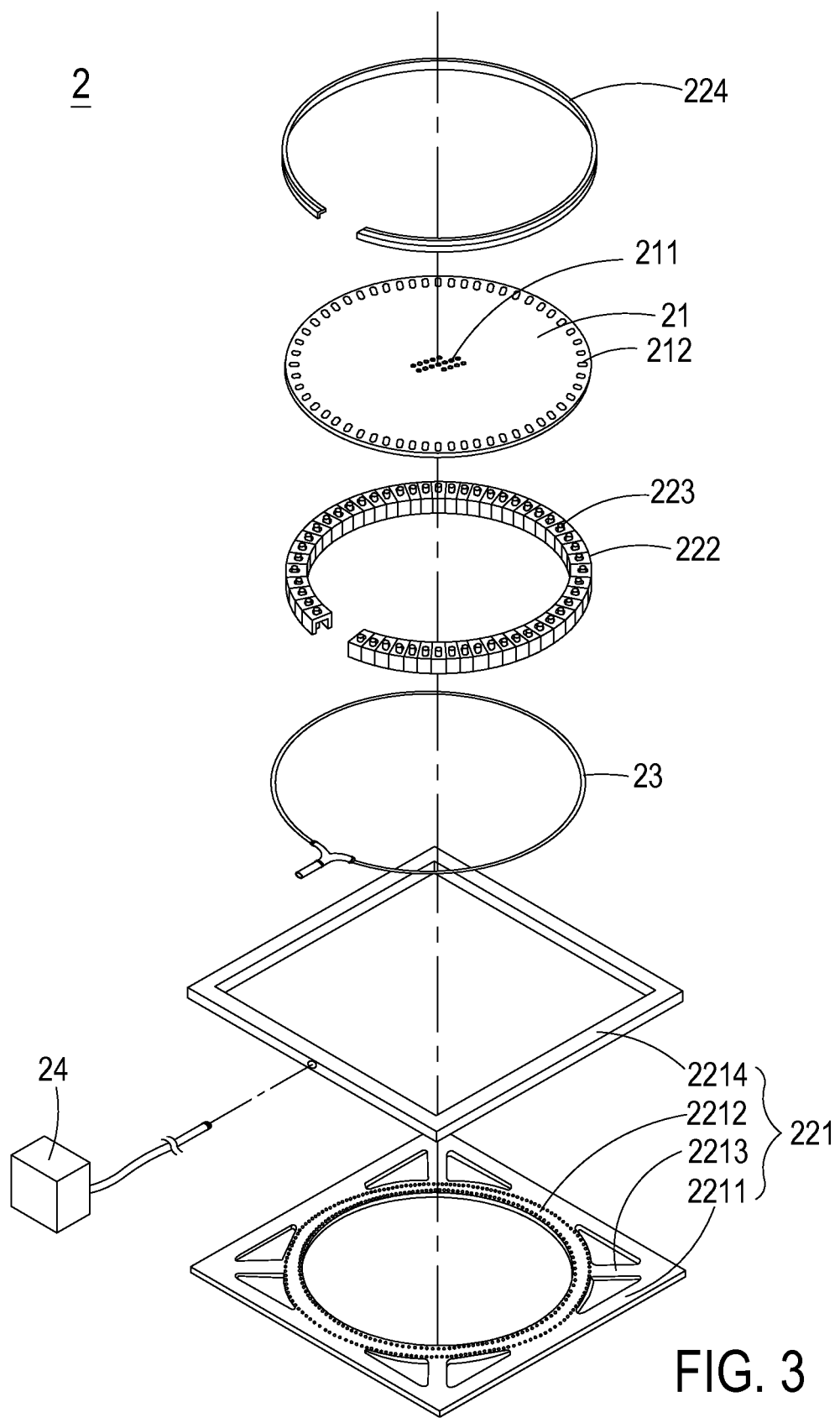
FIG. 3 is a schematic exploded view illustrating the stencil assembly structure according to the embodiment of the present invention.

FIG. 2 is a schematic view illustrating a stencil assembly structure according to an embodiment of the present invention and FIG. 3 is a schematic exploded view illustrating the stencil assembly structure according to the embodiment of the present invention. As shown in FIG. 2 and FIG. 3, the stencil assembly structure 2 comprises a stencil 21, a fixing frame 22, a deformable tube 23 and a gas supplying device 24. The stencil 21 comprises plural first apertures 211 and plural second apertures 212. The plural first apertures 211 are formed by a laser cutting process, and collaboratively defined as a solder paste printing pattern. It is preferred that the stencil 21 is a circular stencil. Moreover, the plural second apertures 212 are discretely and circularly arranged along an outer edge of the stencil 21.

Figure 5A:
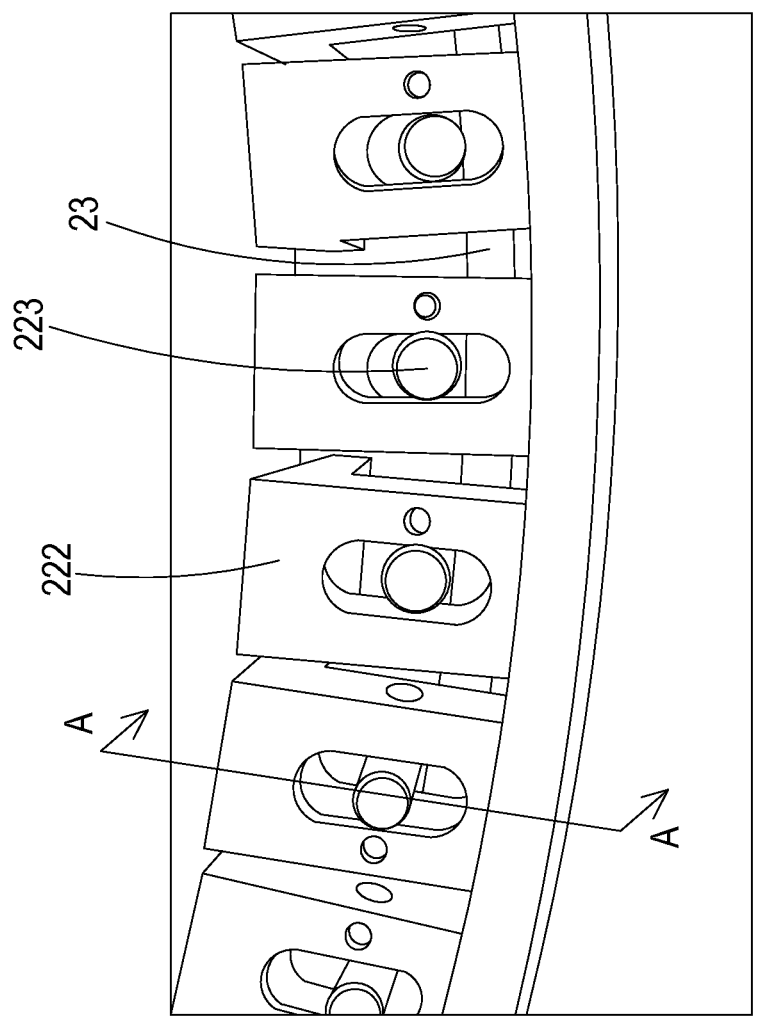
FIG. 5A is a schematic perspective view illustrating a portion of the stencil assembly structure before gas filling according to the embodiment of the present invention (where the stencil is removed to show the deformable tube)

The fixing frame 22 comprises a frame body 221 and plural fixing seats 222. The frame body 221 comprises a rectangular support region 2211 and a ring-shaped support region 2212. The ring-shaped support region 2212 is located inside the rectangular support region 2211. The rectangular support region 2211 and the ring-shaped support region 2212 are connected with each other through plural ribs 2213. The frame body 221 further comprises an outer frame plate 2214 disposed on the rectangular support region 2211 of the frame body 221. The plural fixing seats 222 are circularly arranged on the ring-shaped support region 2212 of the frame body 221. Particularly, the plural fixing seats 222 are independently and discretely disposed on the ring-shaped support region 2212 of the frame body 221, and preferably, any two adjacent fixing seats 222 have the same interval (as shown in FIG. 5A).

Each of the fixing seats 222 has a guide pin 223, which is protruded out of a top surface 2222 of the frame body 221 (as shown in FIG. 4B). After the plural guide pins 223 on the plural fixing seats 222 are penetrated through the corresponding second apertures 212 of the stencil 21, the stencil 21 is hitched on the plural guide pins 223, so that the stencil 21 is fixed on the plural fixing seats 222.

In an embodiment, the stencil 21 is made of a metallic material. For example, the stencil 21 is a stainless steel plate, but is not limited thereto. Moreover, the plural fixing seats 222 and the plural guide pins 223 are also made of a metallic material, such as aluminum, but are not limited thereto.

As previously described, the tension cannot be uniformly and properly distributed on the rectangular steel plate. Experiments demonstrated that the tension can be distributed on the circular stencil more uniformly and properly. In other words, the use of the circular stencil in the present invention can enhance the printing quality.

Figure 4A:
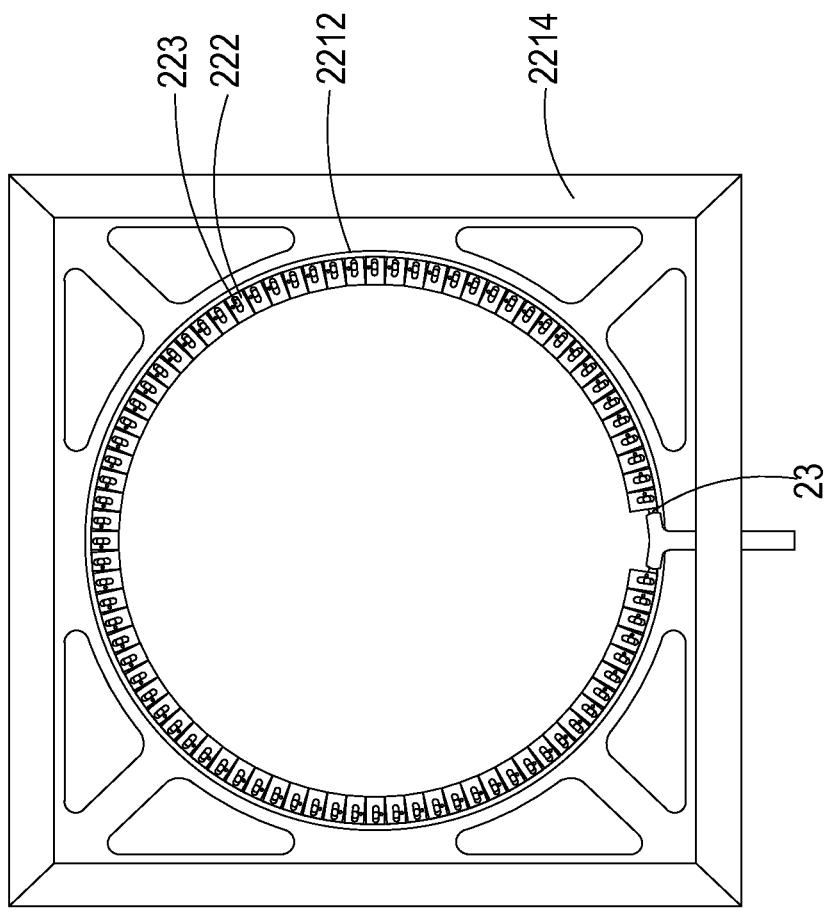
FIG. 4A is a schematic top view illustrating a fixing frame of the stencil assembly structure according to the embodiment of the present invention.

Hereinafter, the relationships between the plural guide pins 223 and the plural fixing seats 222 will be illustrated with reference to FIGS. 4A, 4B and 4C. FIG. 4A is a schematic top view illustrating a fixing frame of the stencil assembly structure according to the embodiment of the present invention. FIG. 4B is a schematic perspective view illustrating a portion of the fixing frame of the stencil assembly structure according to the embodiment of the present invention. FIG. 4C is a schematic exploded view illustrating a fixing seat and a guide pin of the fixing frame of the stencil assembly structure according to the embodiment of the present invention. As shown in FIGS. 4A, 4B and 4C, the fixing seats 222 are disposed on the ring-shaped support region 2212 of the frame body 221. Each of the fixing seats 222 comprises a slot 2221 for allowing a corresponding guide pin 223 to pass through. In addition, a top portion of the guide pin 223 is protruded out of a top surface 2222 of the corresponding fixing seat 222. After the plural guide pins 223 are penetrated through the corresponding second apertures 212 of the stencil 21, the stencil 21 is attached on the top surfaces 2222 of the fixing seats 222.

In this embodiment, the fixing seat 222 has a generally inverted U-shaped structure with a bottom notch 2223, and the lower portion of the guide pin 223 is accommodated in the bottom notch 2223. When the plural fixing seats 222 are circularly arranged on the ring-shaped support region 2212 of the frame body 221, the bottom notches 2223 are communicated with each other to form a circular channel. Moreover, the fixing seats 222 are fixed on the ring-shaped support region 2212 of the frame body 221 through an adhering means, a fastening means or a screwing means. It is noted that the ways of fixing the fixing seats 222 are not restricted.

According to the design of the present invention, the guide pin 223 is movably disposed on the fixing seat 222. In an embodiment, the guide pin 223 is axially connected with the fixing seat 222. As shown in FIG. 4C, except a stick body 2231, the guide pin 223 further comprises a shaft 2232 which is perpendicular to the stick body 2231 and extends toward two opposite sides from the stick body 2231. Corresponding to the shaft 2232 of the guide pin 223, the fixing seat 222 comprises two perforations 2224 at the two opposite side walls of the slot 2221. When the guide pin 223 and the fixing seat 222 are assembled, the top portion of the stick body 2231 of the guide pin 223 is penetrated through the slot 2221 of the fixing seat 222 and protruded out of the top surface 2222 of the fixing seat 222, and the shaft 2232 of the guide pin 223 is penetrated through the two perforations 2224 of the fixing seat 222, so that the guide pin 223 is able to be rotated or swung with respect to the fixing seat 222.

In an embodiment, a cross-section of the slot 2221 of the fixing seat 222 is substantially a long ellipse, and a long axis of the long ellipse is extended in the radial direction of the ring-shaped support region 2212. The guide pin 223 is also swung in the radial direction of the ring-shaped support region 2212, so that the top portion of the guide pin 223 may be moved toward or away from the center of the circular stencil 21.

To ensure the tension of the stencil 21 can be maintained at a sufficient level for minimizing the possibility of detaching the solder paste, the stencil assembly structure 2 of the present invention is provided with a tension adjusting mechanism, which employs the deformable tube 23 and the gas supplying device 24 (as shown in FIG. 2 and FIG. 3). The two ends of the deformable tube 23 is connected with the gas supplying device 24, which is used to adjust the gas amount in the deformable tube 23. Due to the deformation of the deformable tube 23 resulted from gas pressure in the deformable tube 23, the guide pins 223 are moved and the tension of the stencil 21 is adjusted. The detail of the tension adjusting mechanism will be described as follows.

Figure 5B:
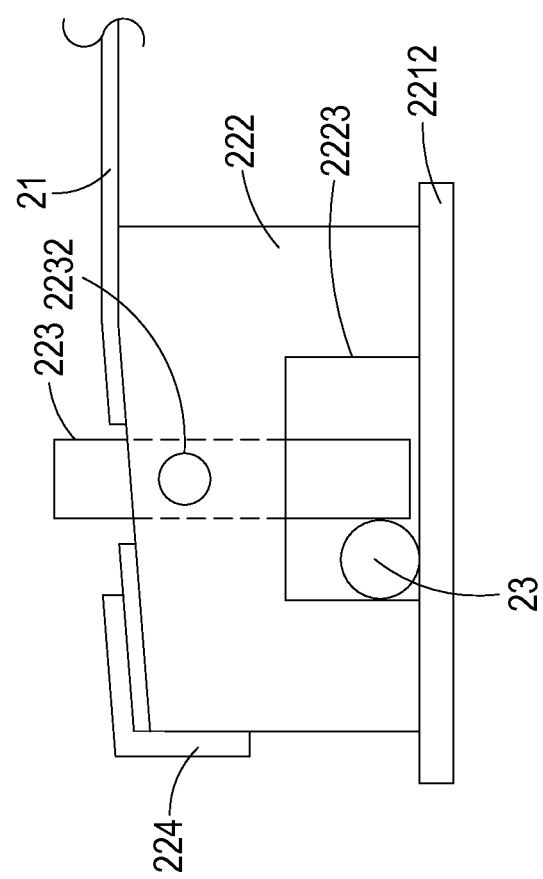
FIG. 5B is a schematic cross-sectional view illustrating the stencil assembly structure of FIG. 5A with the stencil and taken along a line AA.

FIG. 5A is a schematic perspective view illustrating a portion of the stencil assembly structure before gas filling according to the embodiment of the present invention (where the stencil is removed to show the deformable tube), and FIG. 5B is a schematic cross-sectional view illustrating the stencil assembly structure of FIG. 5A with the stencil and taken along a line AA. As shown in FIGS. 5A and 5B, the deformable tube 23 is accommodated in the circular channel formed by the bottom notches 2223 of the plural fixing seats 222, and with respect to the guide pins 223, the deformable tube 23 is located at a side away from the center of the circular stencil 21. When the gas supplying device 24 does not fill gas into the deformable tube 23, the deformable tube 23 does not push the lower portion of the guide pin 223, and thus, the top portion of the guide pin 223 does not move.

Figure 6A:
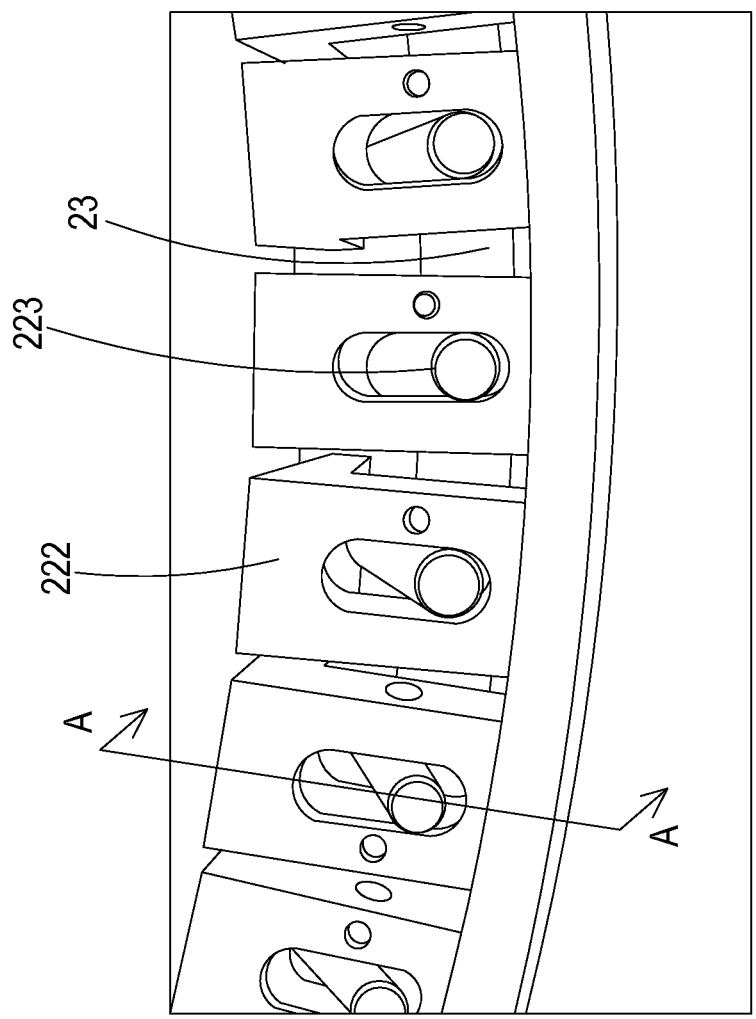
FIG. 6A is a schematic perspective view illustrating a portion of the stencil assembly structure after gas filling according to the embodiment of the present invention (where the stencil is removed to show the deformable tube)
Figure 6B:
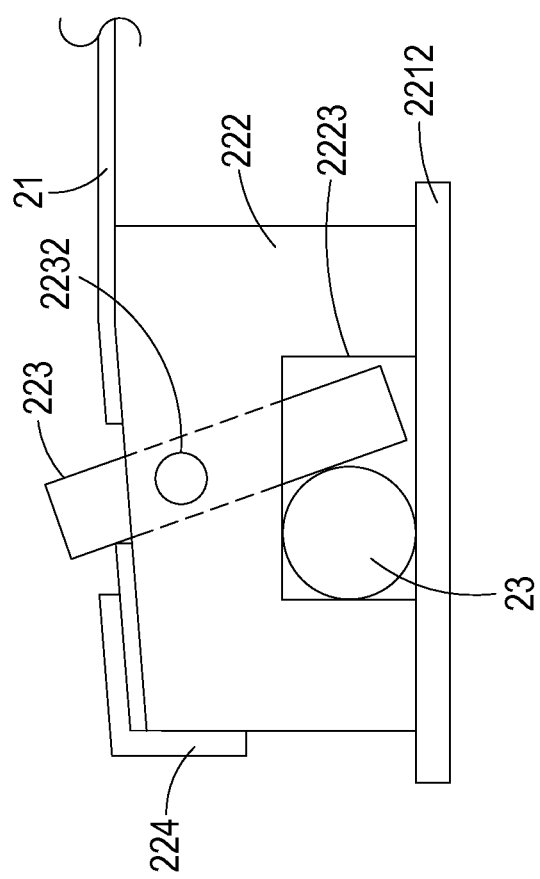
FIG. 6B is a schematic cross-sectional view illustrating the stencil assembly structure of FIG. 6A with the stencil and taken along a line AA.

FIG. 6A is a schematic perspective view illustrating a portion of the stencil assembly structure after gas filling according to the embodiment of the present invention (where the stencil is removed to show the deformable tube), and FIG. 6B is a schematic cross-sectional view illustrating the stencil assembly structure of FIG. 6A with the stencil and taken along a line AA. As shown in FIGS. 6A and 6B, when the gas supplying device 24 fills gas into the deformable tube 23, the deformable tube 23 becomes inflated and deformed, and the inflated and deformed deformable tube 23 pushes the lower portion of the guide pin 223. Since the guide pin 223 is axially connected with the fixing seat 222 through the shaft 2232, the lower portion of the guide pin 223 is moved toward the center of the circular stencil 21, and the top portion of the guide pin 223 is moved away from the center of the circular stencil 21. Since the stencil 21 is hitched on the guide pins 223, the tension of the stencil 21 is correspondingly adjusted.

Certainly, the deformable tube 23 may have different degrees of deformation due to different amounts of filling gas, so the top portions of the guide pins 223 have the tendency to be moved away from or toward the center of the circular stencil 21. Therefore, different degrees of tension adjustment may be applied to the stencil 21 through gas filling and gas releasing.

Consequently, according to the design of the present invention, the tension of the stencil 21 can be adjusted by means of the deformable tube 23. Especially, if the tension is insufficient after the stencil 21 is used for a certain time period, the tension of the stencil 21 may be adjusted by the tension adjusting mechanism. Under this circumstance, the tension of the stencil 21 is enhanced, the possibility of detaching the solder paste is minimized, and the printing quality is enhanced.

In addition, since the stencil 21 of the present invention is a circular stencil, the tension can be distributed on the circular stencil more uniformly and properly. During the tension adjustment, since the plural fixing seats 222 and the plural guide pins 223 also have circular arrangements and the plural fixing seats 222 are independently and discretely disposed on the frame body 221, the deformable tube 23 pushes each guide pin 223 independently and directly and moves the top portion of each guide pin 223 away from the center of the circular stencil 21 upon gas filling. In other words, the deformable tube 23 independently and directly adjusts and moves each guide pin 223, so the tension adjustment is uniform and the tension can also be distributed on the circular stencil uniformly and properly during the tension adjustment.

Moreover, the process of assembling the stencil 21 and the fixing frame 22 is very simple. After the plural guide pins 223 on the plural fixing seats 222 are penetrated through the corresponding second apertures 212 of the stencil 21, the stencil 21 can be fixed on the fixing frame 22. Consequently, even if the solder paste printing pattern is changed, overdue or damaged, the user only has to replace the stencil 21 without the need of disassembling and re-assembling the fixing frame 22. In other words, the stencil assembly structure 2 can be fabricated in a simplified and cost-effective manner.

Please refer to FIG. 3 and FIG. 5B again. The fixing frame 22 further comprises a locking ring 224. The size and shape of the locking ring 224 match the size and shape of the stencil 21. In addition, the locking ring 224 has an L-shaped cross section. The locking ring 227 is capable of locking the stencil 21 on the fixing seats 222, thereby preventing detachment of the stencil 21 from the fixing seats 222. In an embodiment, the locking ring 224 can be fixed on the fixing seats 222 through a screwing means, such as using screws, but not limited thereto.

From the above descriptions, the present invention provides a stencil assembly structure for printing solder paste on a printed circuit board. The stencil assembly structure includes a stencil, a fixing frame, a deformable tube and a gas supplying device. The stencil includes plural first apertures and plural second apertures. The plural first apertures are collaboratively defined as a solder paste printing region. The fixing frame includes a frame body and plural fixing seats, the plural fixing seats are independently and discretely disposed on the frame body and have a circular arrangement, and each fixing seat has a guide pin. After the plural guide pins are penetrated through the corresponding second apertures of the stencil, the stencil is fixed on the plural fixing seats. The deformable tube is disposed at the bottoms of the plural fixing seats. The gas supplying device is connected with the deformable tube and is configured to adjust gas amount in the deformable tube. Due to deformation of the deformable tube resulted from gas pressure in the deformable tube, the guide pins are moved and a tension of the stencil is adjusted. According to the design of the present invention, the tension of the stencil can be adjusted to be maintained at a sufficient level. Under this circumstance, the possibility of detaching the solder paste is minimized, and the printing quality is enhanced. In addition, since the process of assembling the stencil and the fixing frame is very simple, the stencil assembly structure can be fabricated in a simplified and cost-effective manner. Moreover, since the tension can be distributed on the circular stencil more uniformly and properly, the printing quality is enhanced, and since the deformable tube independently and directly adjusts and moves each guide pin, the tension adjustment is also uniform. Therefore, the stencil assembly structure of the present invention can overcome the disadvantages of the prior art technology.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. A stencil assembly structure for printing solder paste on a printed circuit board, the stencil assembly structure comprising:
   a stencil comprising plural first apertures and plural second apertures, wherein the plural first apertures are collaboratively defined as a solder paste printing pattern;
   a fixing frame comprising a frame body and plural fixing seats, wherein the plural fixing seats are independently and discretely disposed on the frame body and have a circular arrangement, each of the plural fixing seats has a guide pin, the guide pin is axially connected with the fixing seat, so that the guide pin is able to be rotated or swung with respect to the fixing seat, and after the plural guide pins of the plural fixing seats are penetrated through the corresponding second apertures of the stencil, the stencil is fixed on the plural fixing seats;
   a deformable tube disposed at bottoms of the plural fixing seats; and
   a gas supplying device connected with the deformable tube and configured to adjust gas amount in the deformable tube, wherein due to deformation of the deformable tube resulted from gas pressure in the deformable tube, the plural guide pins are moved and a tension of the stencil is adjusted.

2. The stencil assembly structure according to claim 1, wherein the stencil is a circular stencil.

3. The stencil assembly structure according to claim 1, wherein the frame body comprises a rectangular support region and a ring-shaped support region, and the ring-shaped support region is located inside the rectangular support region.

4. The stencil assembly structure according to claim 3, wherein the frame body comprises plural ribs connected between the rectangular support region and the ring-shaped support region.

5. The stencil assembly structure according to claim 3, wherein the fixing frame further comprises an outer frame plate disposed on the rectangular support region.

6. The stencil assembly structure according to claim 3, wherein the plural fixing seats are arranged on the ring-shaped support region.

7. The stencil assembly structure according to claim 1, wherein any two adjacent fixing seats have the same interval.

8. The stencil assembly structure according to claim 1, wherein each of the plural fixing seats comprises a slot for allowing a corresponding guide pin to pass through, and each of the plural guide pins is protruded out of a top surface of the corresponding fixing seat.

9. The stencil assembly structure according to claim 1, wherein the fixing seat has a generally inverted U-shaped structure with a bottom notch, and a lower portion of the guide pin is accommodated in the bottom notch.

10. The stencil assembly structure according to claim 9, wherein the deformable tube is accommodated in the bottom notch of the fixing seat.

11. The stencil assembly structure according to claim 1, wherein with respect to the guide pin, the deformable tube is located at a side away from a center of the stencil.

12. The stencil assembly structure according to claim 1, wherein when the gas supplying device fills gas into the deformable tube, the deformable tube pushes a lower portion of the guide pin, so that a top portion of the guide pin is moved away from a center of the stencil, and since the stencil is hitched on the guide pins, the tension of the stencil is correspondingly adjusted.

13. The stencil assembly structure according to claim 1, wherein the guide pin comprises a shaft which is penetrated through two corresponding perforations of the fixing seat, so that the guide pin is able to be rotated or swung with respect to the fixing seat.

14. The stencil assembly structure according to claim 1, wherein the fixing frame further comprises a locking ring for locking the stencil on the plural fixing seats.

* * * * *